United States Patent
DeCaro

(10) Patent No.: US 7,275,128 B2
(45) Date of Patent: *Sep. 25, 2007

(54) SELECTABLE BLOCK PROTECTION FOR NON-VOLATILE MEMORY

(75) Inventor: Richard V. DeCaro, El Dorado Hills, CA (US)

(73) Assignee: Atmel Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/457,611

(22) Filed: Jul. 14, 2006

(65) Prior Publication Data

US 2007/0016741 A1 Jan. 18, 2007

Related U.S. Application Data

(63) Continuation of application No. 10/835,410, filed on Apr. 28, 2004, now Pat. No. 7,093,091.

(60) Provisional application No. 60/506,183, filed on Sep. 26, 2003.

(51) Int. Cl.
*G06F 12/16* (2006.01)
*G11C 11/34* (2006.01)

(52) U.S. Cl. .................. 711/103; 711/163; 365/185.33; 365/185.29; 365/195

(58) Field of Classification Search ..................... None
See application file for complete search history.

(56) References Cited

U.S. PATENT DOCUMENTS

| 5,592,641 | A | 1/1997 | Fandrich et al. |
| 5,749,088 | A | 5/1998 | Brown et al. |
| 5,930,826 | A | 7/1999 | Lee et al. |
| 5,974,500 | A | 10/1999 | Maletsky et al. |
| 6,032,237 | A | 2/2000 | Inoue et al. |
| 6,034,889 | A | 3/2000 | Mani et al. |
| 6,330,648 | B1 * | 12/2001 | Wambach et al. ........... 711/163 |
| 2002/0007437 | A1 * | 1/2002 | Chan et al. .................. 711/111 |

* cited by examiner

*Primary Examiner*—Jasmine Song
(74) *Attorney, Agent, or Firm*—Schneck & Schneck; Thomas Schneck

(57) ABSTRACT

A semiconductor non-volatile memory device, particularly a flash memory array, having a chip configuration with a plurality of pins including a write protect pin, a serial in pin and an optional parallel data bus with input-output pins ($I/O_{7-0}$), plus other pins, all electrically communicating with the memory array and particularly a sector protection register of variable size and location. The sector protection register defines which sectors or group of sub-sectors to protect and is controlled by the use of commands via the serial in pin or the optional input-output pins. The sector protection may be selectably controlled by either use of a signal to the write protect pin or use of commands via the serial in pin or the optional input-output pins to the command and control logic. A logic circuit instantly determines whether the write protect pin or the commands are controlling the sector protection.

21 Claims, 10 Drawing Sheets

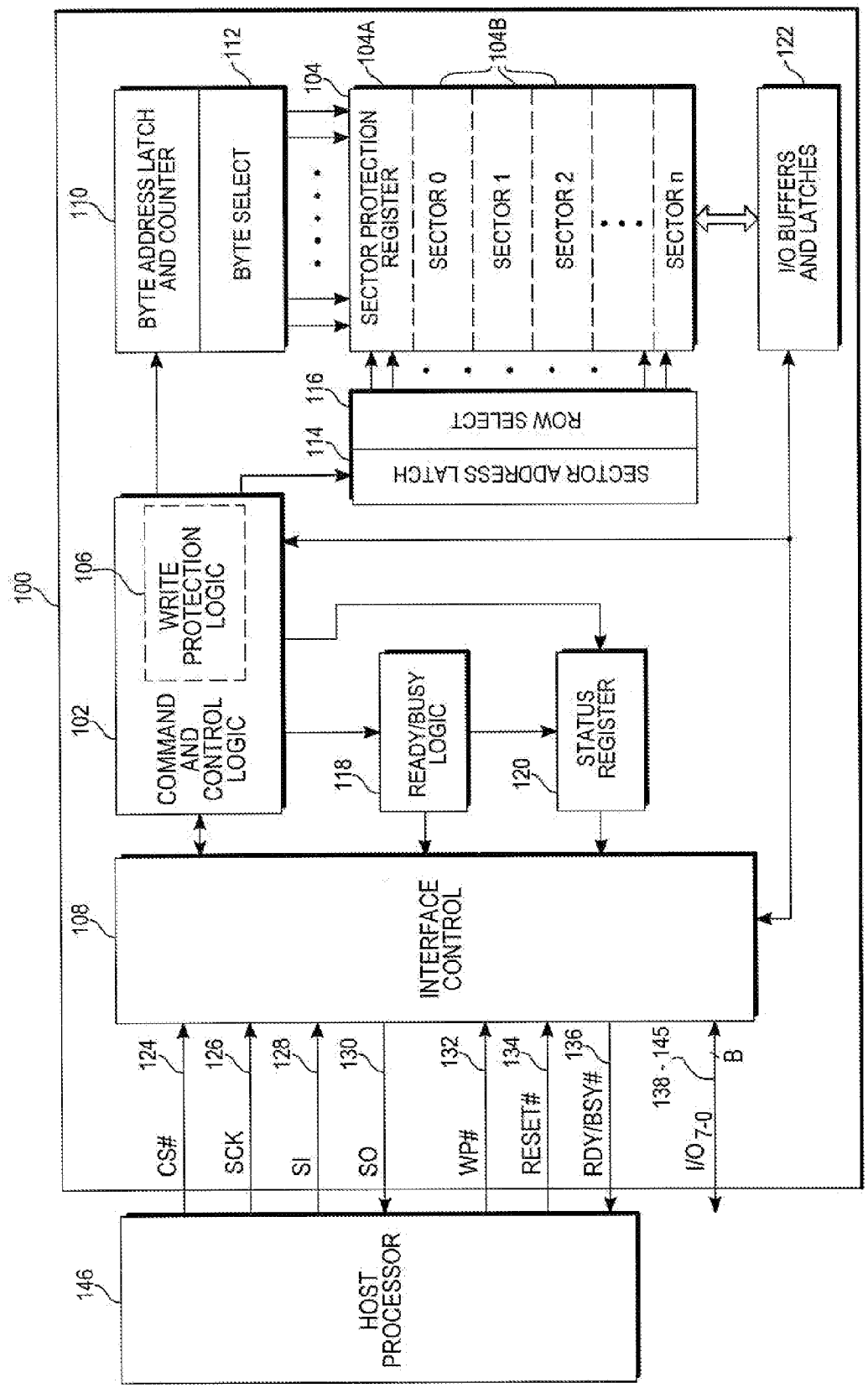
Fig._1

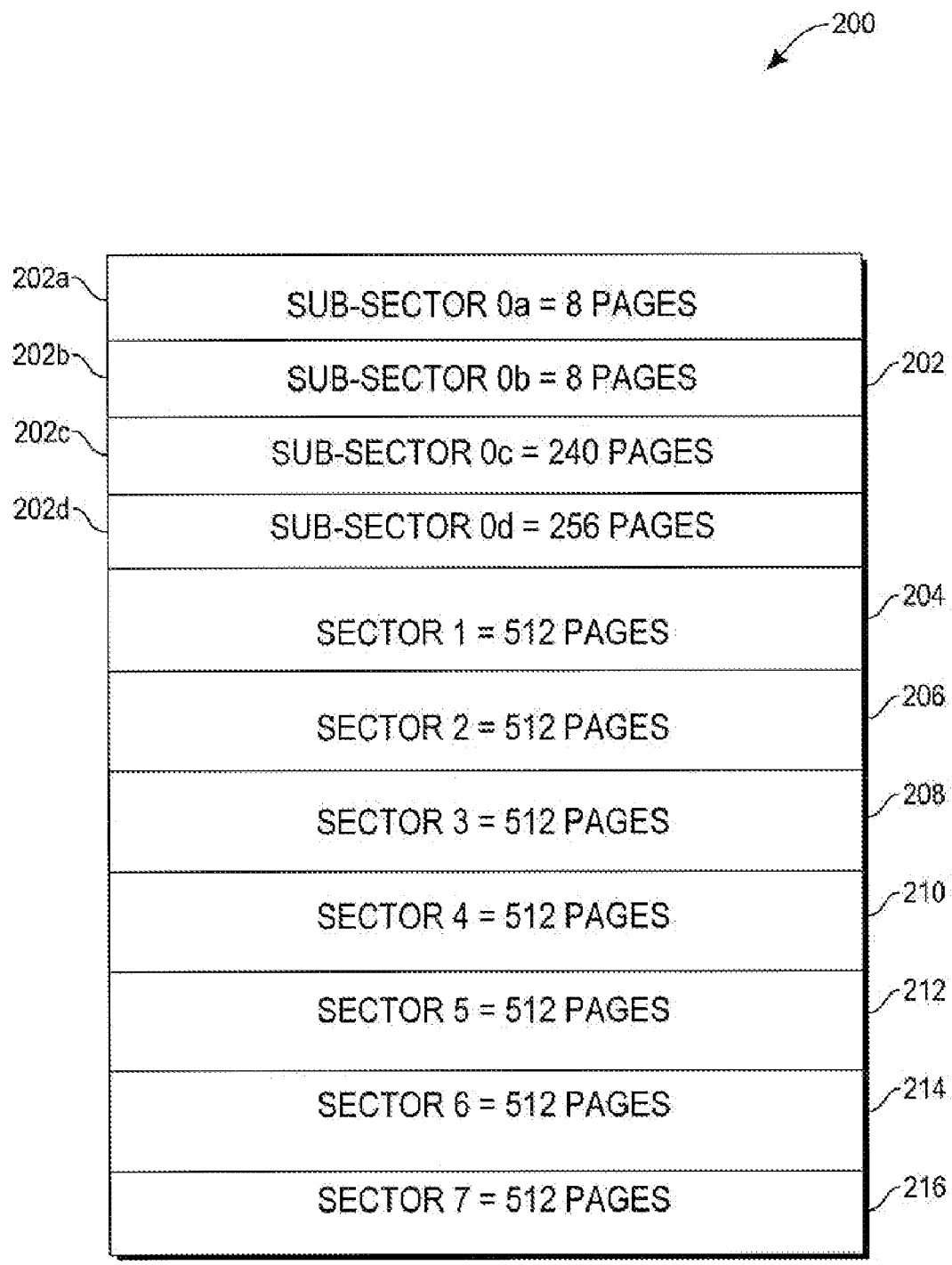
Fig._2

| SECTOR NUMBER | 0a | 0b | 0c | 0d | 1 | 2 | 3 | 4 | 5 | 6 | 7 |
|---|---|---|---|---|---|---|---|---|---|---|---|
| PROTECT | F0H (11110000) | | | | FFH | 00H | 00H | 00H | 00H | 00H | FFH |

00H = UNPROTECT
FFH = PROTECT (EXCEPT SECTOR 0)

Fig._3A

| | SUB - SECTOR | | | | DATA VALUE |
|---|---|---|---|---|---|
| | 0a | 0b | 0c | 0d | |
| UNPROTECTED | 00 | 00 | 00 | 00 | 00H |
| SECTOR 0d | 00 | 00 | 00 | 11 | 03H |
| SECTOR 0c | 00 | 00 | 11 | 00 | 0AH |
| SECTOR 0c, 0d | 00 | 00 | 11 | 11 | 0FH |
| SECTOR 0b | 00 | 11 | 00 | 00 | 30H |
| ⋮ | ⋮ | | | | ⋮ |
| SECTOR 0a, 0c, 0d | 11 | 00 | 11 | 11 | AFH |
| SECTOR 0a, 0b | 11 | 11 | 00 | 00 | F0H |
| SECTOR 0a, 0b, 0d | 11 | 11 | 00 | 11 | F3H |
| SECTOR 0a, 0b, 0c | 11 | 11 | 11 | 00 | FAH |
| PROTECT ENTIRE SECTOR 0 | 11 | 11 | 11 | 11 | FFH |

| COMMAND | BYTE 1 | BYTE 2 | BYTE 3 | BYTE 4 | DATA (N BYTES) |
|---|---|---|---|---|---|
| ERASE SECTOR PROTECTION REG. | 3DH | 2AH | 7FH | CFH | NOT NEEDED |
| PROGRAM SECTOR PROTECTION REG. | 3DH | 2AH | 7FH | FCH | REG. DATA |
| READ SECTOR PROTECTION REG. | 32H | 00H | 00H | 00H | REG. DATA |

Fig. _ 4B

| BYTE 1 | BYTE 2 | BYTE 3 | BYTE 4 | DATA BYTE 1 | DATA BYTE 2 | ... | DATA BYTE N |
|---|---|---|---|---|---|---|---|
| 3DH | 2AH | 7FH | FCH | DATA | DATA | ... | DATA |
| 00111101 | 00101010 | 01111111 | 11111100 | DDDD DDDD | DDDD DDDD | ... | DDDD DDDD |

Fig. _ 4C

| BYTE 1 | BYTE 2 | BYTE 3 | BYTE 4 | DON'T CARE | DATA BYTE 1 | DATA BYTE 2 | ... | DATA BYTE N |
|---|---|---|---|---|---|---|---|---|
| 32H | 00H | 00H | 00H | X ... X | DATA | DATA | ... | DATA |
| 00110010 | 00000000 | 00000000 | 00000000 | X ... X | DDDD DDDD | DDDD DDDD | ... | DDDD DDDD |

| COMMAND | BYTE 1 | BYTE 2 | BYTE 3 | BYTE 4 |
|---|---|---|---|---|
| ENABLE SECTOR PROTECTION | 3DH | 2AH | 7FH | A9H |
| DISABLE SECTOR PROTECTION | 3DH | 2AH | 7FH | 9AH |

| TIME PERIOD | WP# PIN | ENABLE SECTOR PROTECTION COMMAND | DISABLE SECTOR PROTECTION COMMAND | SECTOR PROTECTION STATUS |
|---|---|---|---|---|
| 1 | HIGH<br>HIGH<br>HIGH | NOT ISSUED PREVIOUSLY<br>X<br>ISSUE COMMAND | X<br>ISSUE COMMAND<br>X | DISABLED<br>DISABLED<br>ENABLED |
| 2 | LOW | X | X | ENABLED |
| 3 | HIGH<br>HIGH<br>HIGH | ISSUED DURING PERIOD 1 OR 2<br>X<br>ISSUE COMMAND | NOT ISSUED YET<br>ISSUE COMMAND<br>X | ENABLED<br>DISABLED<br>ENABLED |

*Fig. _ 5C*

| BIT 7 | BIT 6 | BIT 5 | BIT 4 | BIT 3 | BIT2 | BIT 1 | BIT 0 |
|---|---|---|---|---|---|---|---|
| RDY/BS | COMPARE | DEVICE DENSITY CODE | | | | PROTECT | X |

*Fig. _ 5D*

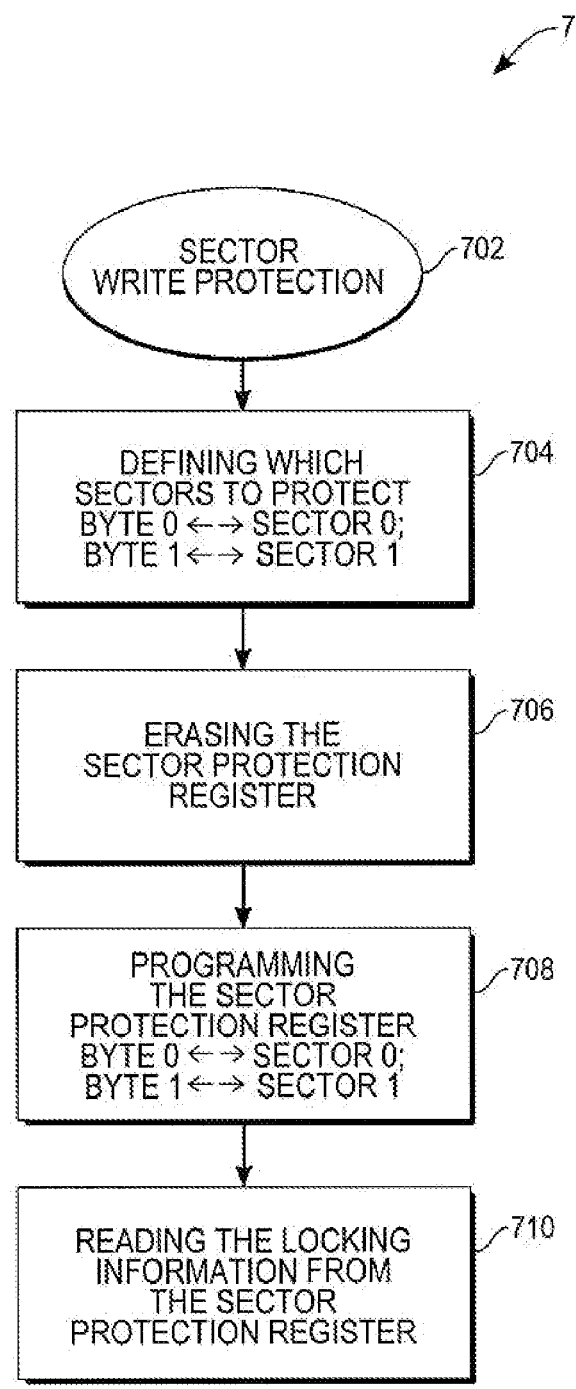
Fig._7

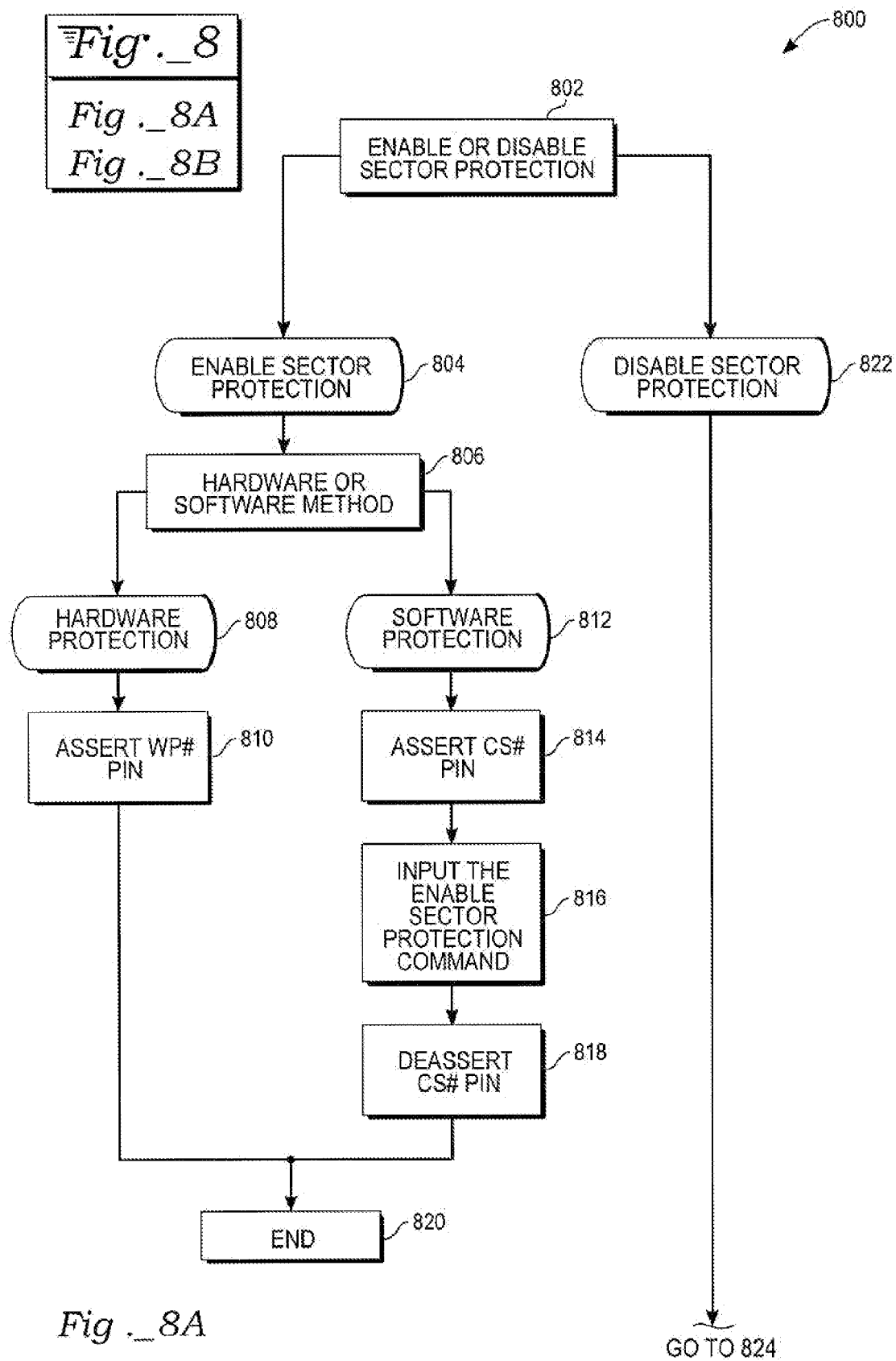
Fig._8A

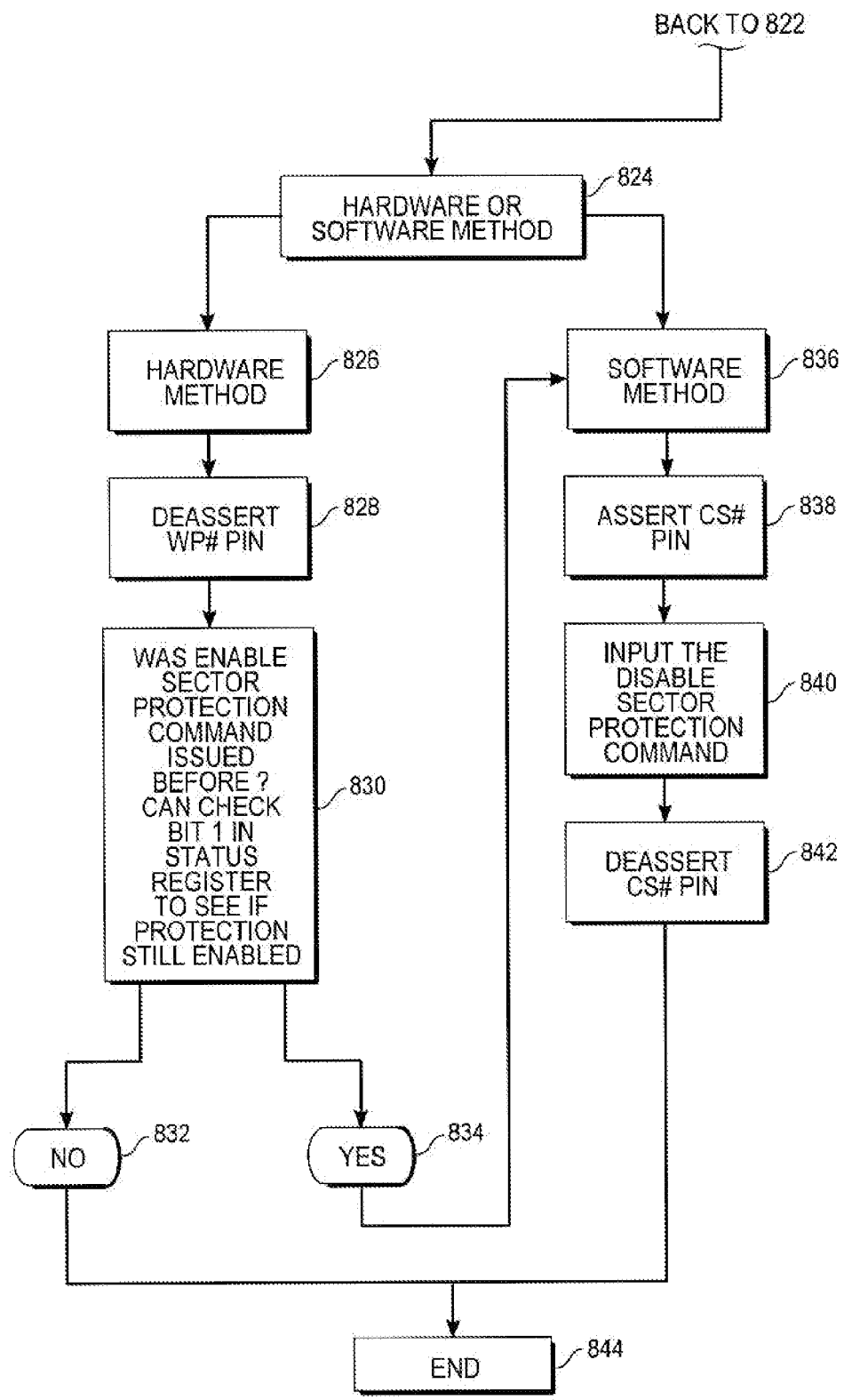
Fig. _8B

SELECTABLE BLOCK PROTECTION FOR NON-VOLATILE MEMORY

CROSS-REFERENCE TO RELATED APPLICATIONS

This application is a continuation application of U.S. patent application Ser. No. 10/835,410, filed Apr. 28, 2004 now U.S. Pat. No. 7,093,091 which claims priority under 35 U.S.C § 119(e) from U.S. provisional application 60/506,183, filed Sep. 26, 2003.

TECHNICAL FIELD

The invention relates to a non-volatile memory device and more specifically to an electrically erasable and programmable non-volatile memory device having write protection capability.

BACKGROUND ART

In certain flash non-volatile memories of the prior art, it has been customary to provide a "write protect" pin associated with a memory chip package to prevent program and erase operations to certain locations, such as a boot block sector. A sector in a flash memory device is simply a partition of the memory array itself. Flash memory devices are comprised of an array of memory cells grouped into a series of rows and columns. Each row contains a cumber of memory cells that represent a number of bytes. Most flash memory arrays are arranged so that a number of rows are then grouped into sectors or blocks in which each sector or block contains thousands of bytes (kilobytes).

It is common for a flash memory array to be divided into several sectors, and in some flash memory devices, the size of the sectors will vary from one another. For example, an 8 megabit device may incorporate a sector arrangement of a single 32 kilobyte sector, eight 4 kilobyte sectors, a single 64 kilobyte sector, and seven 128 kilobyte sectors. In a particular system design, the first sector in the array, the 32 kilobyte sector, may be allocated to store boot code, while the smaller 4 kilobyte sectors may be allocated for configuration data and parameter storage. Some of the larger sectors in the array may be used to store the system's main program code with the remaining sectors allocated for user data storage.

In many system designs, it is desirable to protect some of these sectors against unintentional or malicious program and erase operations. In the example described above, the sectors storing the boot code, the configuration data, and the main program code would most likely need to be protected. If any of these sectors were to be inadvertently erased or programmed with erroneous information, then the system would not function properly. The sectors allocated for user data storage are less critical and would not have an impact on the basic system operation if they were erased and reprogrammed, so they would most likely not need to be protected.

Previously defined methods for write protection schemes have been limited in their flexibility and function. An object of the invention was to provide a write protection method for a non-volatile memory device that is much more versatile and flexible than previously existed.

SUMMARY OF THE INVENTION

The above object has been met in a non-volatile memory device by providing a combination of a user programmable sector protection register and a sector protection scheme controlled by both software commands and by a write protect pin that are independently available for the same memory device.

Some users may wish to use hardware protection methods that can be controlled via a write protect pin through a host processor or ASIC. Such users might believe that the hardware protection method is more secure and reliable because it can prevent the memory device from processing inadvertent program or erase commands that may be sent from other devices residing on the same memory bus. Other users, however, may not wish to or cannot afford to supply an extra signal to the memory device to control the hardware write protection pin. These users may wish to implement a software method to control the write protection of the memory device.

In the present invention, a user selects the sectors to be protected by programming specific data in a defined area, for example, a specific row identified as the sector protection register, with a special command sequence for erasing, programming or reading it. The sectors defined or flagged for protection can then be protected against program and erase operations by issuing a specific command sequence to enable the sector protection. Alternatively, sectors flagged for protection as defined in the sector protection register can be protected by asserting the write protect pin and keeping the pin in the asserted state. Use of the write protect pin will also block the use of the software command sequence for disabling sector protection. In this manner a user may select an appropriate sector protection modality, or can mix modalities.

Preferably, a single extra row of the entire memory array is used as the section protection register, with each byte of the sector protection register being used to store sector locking information for a specific sector number (or sub-sector) of the memory. Since a single row of memory cells is used, the number of sectors that can be protected or unprotected can be increased or decreased, depending upon the density of the memory device. Because only one sector protection register is needed and programmed to specify which sectors are to be protected, only a single command needs to be issued. Thus, a single operation is needed to specify protection for a single sector or multiple sectors. A method for sector protection using the sector protection register may include the following steps: (1) defining the sectors to protect; (2) erasing the sector protection register; (3) programming the sector protection register with each byte denoting a corresponding sector to be protected, i.e., byte 0 for sector 0, byte 1 for sector 1, etc. byte N for sector N; and (4) performing write protection by either a software or a hardware controlled method.

BRIEF DESCRIPTION OF THE DRAWINGS

FIG. 1 is a schematic diagram of a system containing a host processor and a memory device with a memory array having a sector protection register in accordance with the present invention.

FIG. 2 is a plan of a memory array of the type shown in FIG. 1 that is divided into sectors wherein the first sector is divided into four sub-sectors.

FIG. 3A illustrates an arrangement of a sector protection register for use with the memory array shown in FIG. 2 wherein each byte contains sector locking information.

FIG. 3B illustrates an example of sector 0 protection values for the sector protection register shown in FIG. 3A.

FIG. 4A illustrates a command sequence such as erase, program, and read that are used to access the sector protection register of the type shown in FIG. 3A.

FIG. 4B illustrates a byte and bit-level structure of the command used to program the sector protection register of the type shown in FIG. 3A.

FIG. 4C illustrates a byte and bit-level structure of the command used to read the sector protection register of the type shown in FIG. 3A.

FIG. 5C illustrates a tables showing sector protection status for various scenarios of a write protection pin carrying a write protection signal, as shown in FIG. 5B, for issuing an enable sector protection command, and for a disable issuing sector protection command.

FIG. 5D illustrates the format of a status register used in the system shown in FIG. 1.

FIG. 7 is a flow chart of a sector protection method according to the present invention.

FIG. 8, composed of FIGS. 8A and 8B, is a flow diagram of a method to enable or disable the sector protection.

PREFERRED EMBODIMENT OF THE DESCRIPTION

Figures 5A, 5B:
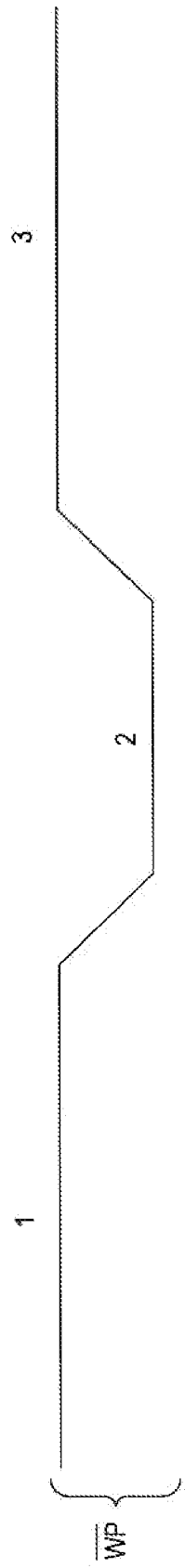
FIG. 5A illustrates a table listing values of the enable sector protection and disable sector protection commands for the sector protection register shown in FIG. 2A.
FIG. 5B illustrates a graph of a write protection signal used with the system shown in FIG. 1.

With reference to FIG. 1, a computer memory device 100 has a non-volatile memory array 104 with a sector protection register 104A. The sector protection register 104A is adapted to store protection or locking information. Each byte of the sector protection register is used to store the sector locking information for a sector, or a series of sub-sectors, of the memory array 104.

A host processor 146 communicates with memory array 104 through interface control 108, a serial interface having the following pins: chip select pin 124 (CS#), system clock pin 126 (SCK), serial data in pin 128 (SI), serial data out pin 130 (SO), write protection pin 132 (WP#), reset pin 134 (RESET#), and status pin 136 (RDY/BSY#). In addition to interfacing through the serial data in pin 128 and serial data out pin 130, the host processor 146 can communicate with the memory device using the eight input/output pins 138-145 (I/O). Data being input into the device is fed through the interface control 108 and is then either (a) processed by command and control logic 102 if the data is an opcode command or address, or (b) sent to memory array 104 through I/O buffers and latches 122 if the data is raw data. Data output from memory array 104 is fed through I/O buffers and latches 122 and then through interface control 108. In addition, the data can be fed to command and control logic 102 for certain functions including the internal reading of the sector protection register 104A. Feedback on device functions is output through interface control 108 from command and control logic 102, ready/busy logic 118, and status register 120. The interface control 108, command and control logic 102 and ancillary circuits and pins, as well as the memory array architecture are well known. For example, see Data Flash Application Note AN-4 at www.atmel.com.

The memory array 104 is a non-volatile flash memory array arranged into rows and columns, which are grouped into sectors 104B. In a preferred embodiment, an 8 megabit memory array 104 is used.

The sector protection register 104A is incorporated into the memory array 104 by using a single extra row of such array. The sector protection register 104A comprises a number of bytes. Each byte contains the locking information corresponding to a sector or a number of sub-sectors.

The command and control logic 102 is used to control the internal functions of the device in response to signal inputs sent to the interface control 108. The write protection logic 106 is part or the overall command and control logic 102. One function that the command and control logic 102 carries out is to pass addressing information on to, as well as control, the byte address latch 110 and sector address latch 114. The byte select 112 and row select 116 decode the latched addresses and activate columns and rows in the memory array 104.

The write protection logic 106 is responsible for controlling the sector protection for the device. The write protection logic 106 decodes the state of the write protect pin, WP# input pin 132, as well as processes the "enable sector protection" and "disable sector protection" commands. It is the function of the write protection logic 106 to determine whether program or erase operations to the memory array 104 should be allowed or not.

The write protect (WP#) pin 132, when enabled, starts the hardware controlled write protection process. The ready/busy output 136 reflects the status of the memory array 104 when the sector protection register 104A is being programmed or erased. These control functions will be discussed in greater detail later.

An external host processor 147 may be coupled to the memory device 100 to instruct the command and control logic 102 to carry out a set of instructions. The host processor 146 also determines which sectors to protect against a write or an erase cycle because the host processor 146 contains the address location of a start-up program or vital data that needs to be protected. The external host processor 146 can also be an application specific integrated circuit (ASIC) or a central processing unit (CPU).

FIG. 2 shows more details of the inner structure of a typical memory array 200 in accord with the present invention. The typical memory array 200 is an example of the general memory array 104 of FIG. 1. The memory array 200 comprises 8 sectors 202-216, ranging from sector 0 to sector 7. Each sector in this example has a total of 512 pages or 512 rows of memory cells. The first sector 202, sector 0, is further divided into four sub-sectors 202a-202d: sub-sector 0a, sub-sector 0b, sub-sector 0c, and sub-sector 0d. Sub-sector 0a has 8 pages of memory cells, sub-sector 0b also has 8 pages, sub-sector 0c has 240 pages, and sub-sector 0d has 256 pages. Note that sub-sectors need not be all the same size. Since a single row of memory cells is used as the sector protection register to define which sector or sub-sector are to be protected, the number of sectors and sub-sectors that can be separately protected depends upon the density (number of bytes in a row) of the memory array 200. For example, each row of memory cells in an 8 megabit device may represent 256 bytes. In that case, up to 259 blocks in an 8 megabit device can be separately protected or unprotected, such as the four sub-sectors of sector 0 and up to 255 other sectors.

The locking or protection information contained in the sector protection register is encoded so that the host processor can detect which sectors are flagged for protection and which are not. With reference to FIG. 3A, a table 300A illustrates a typical content of the sector protection register 104A in FIG. 1. A hexadecimal number code indicates whether a sector or sub-sector associated with each register byte is flagged for protection or not. Hexadecimal number FFH may represent protection for a particular sector whereas a hexadecimal number 00H can be used to indicate that a particular sector is to be unprotected. In FIG. 3A, for example, sectors 1 and 7 are flagged for protection, while sectors 2-6, represented by sector protection register bytes 2-6, are not flagged protection. Other hexadecimal byte codes may indicate protection flagging of certain sub-sectors within a particular sector.

FIG. 3B illustrates further details of a typical code for protecting individual sub-sectors of a same sector, such as sector 0. One byte (or 8 bits) is used to specify protection for up to four sub-sectors, such as sub-sectors 0a, 0b, 0c, and 0d of sector 0. Within that byte, pairs of bits correspond to the different sub-sectors, with a pair of "1"s indicating protection of that sub-sector and a pair of "0"s indicating that a sub-sector is not to be protected. Byte 0 of the sector protection register is used for sector 0 and sub-sectors 0a, 0b, 0c, and 0d are arranged from left to right as shown in table 300B. Therefore, the most significant two bits are designated to sub-sector 0a; and the least significant two bits are designated for sub-sector 0d. Sector 0's protection capacity ranges from zero sub-sectors to all sub-sectors. For example, when no sub-sector is protected, the binary value of byte 0 in the sector protection register is 0000000, equivalent to 00H in hexadecimal number, illustrated in the first row 302B of the table 300B. In the second row 304B, sub-sector 0d is protected, the binary value is 00000011, and its equivalent hexadecimal value is 03H. Jumping ahead to the fifth row 310B, where sub-sector 0b is protected, the binary value is 00110000, the hexadecimal equivalence is 30H. Furthermore, any two sub-sectors can be protected at the same time. For example, if sub-sectors 0a, 0b are protected, then the corresponding data value in binary is 11110000 or F0H in hexadecimal, illustrated in row 8 316B. In row 7 314B, sub-sectors 0a, 0c, and 0d are protected, then the binary number is 11001111, its hexadecimal equivalence is AFH. The entire sector 0 can be protected when the data value is specified to be 11111111 or FFH as illustrated in the last row 322B.

With reference to FIG. 4A, typical command codes for the sector protection register 104A are illustrated. The command sequences include instructions to erase, program, or read the sector protection register 104A. Each command instruction has a specific code so that the host processor 146 and the control logic 102 can recognize and decode them. Exemplary codes are listed in table 400A. Hence, for an erase sequence, the hexadecimal command code may be 3DH 2AH 7FH CFH as shown in the first row 402A of table 400A. For a program sequence, the corresponding code may be 3DH 2AH 7FH FCH as shown in the second row 404A. For a read sequence, the code may be 32H 00H 00H 00H, as shown in the third row 404A. Following each command code is the data for the corresponding command. Clearly, in an erase sequence, data is not needed. The data following the program code (FIG. 4B) is the sector protection register information to specify which sectors or sub-sectors should be flagged for protection (FIG. 3). Data following the read code (FIG. 4C) is the contents of the sector protection register (FIG. 3) which reflects the sectors or sub-sectors that are flagged for protection. Reading and programming commands require data to be written to or read from the sector protection register (104A in FIG. 1).

In order to illustrate the operation of these command sequences, refer again to FIG. 1. Usually the first step is to erase the sector protection register 104A before programming it. To erase the sector protection register 104A, the chip select (CS#) pin 124 must first be asserted. Afterward, the appropriate 4-byte command sequence must be clocked in via a serial input (SI) pin 128 or eight parallel bi-directional Input/Output $I/O_{7-0}$) pins 138-145. After the last byte of the command sequence has been clocked in, the chip select (CS#) pin 124 must be de-asserted to initiate the internally self-timed erase cycle. The ready/busy status pin 136 indicates that the device is busy during the erase cycle. The ready/busy status can also be determined by reading the status register 120. If the device is powered down before the completion of the erase cycle, then the contents of the sector protection register 104A cannot be guaranteed. The reset pin 134 is disabled during the erase cycle to prevent incomplete erasure of the sector protection register 104A. The sector protection register 104A can be erased while sector protection is enabled or disabled.

Another feature of the present invention is that the erased state of each bit in the sector protection register 104A is used to indicate that a sector is flagged for protection. Therefore, whenever the sector protection register 104A is erased, all sectors are flagged for protection. This allows the protection scheme to be more effective in the prevention of accidental programming or erasing of a page in the main memory array 104 provided that sector protection is enabled. If for some reason an erroneous program/erase command is sent to the device immediately after erasing the sector protection register 104A and before the register can be reprogrammed, then the erroneous program/erase command will not be processed because all sectors are protected.

To program the sector protection register 104A, the chip select (CS#) pin 124 must first be asserted. Once the chip select (CS#) pin 124 has been asserted, the appropriate 4-byte command sequence must be clocked in via the SI pin 128 or the $I/O_{7-0}$ pins 138-145. After the last byte of the command sequence has been clocked in, the data for the contents of the sector protection register 104A must be clocked in. As illustrated in FIG. 3A, the first byte corresponds to sector 0, the second byte corresponds to sector 1, and so on. If, for example, there are eight sectors in a device, then eight bytes of data must be clocked in. If the proper number of data bytes is not clocked in, the protection status of the sectors corresponding to the bytes not clocked in cannot be guaranteed. For example, if only the first six bytes are clocked in instead of the complete eight bytes. Then the protection status of the last two sectors cannot be guaranteed. After the last data byte has been clocked in, the chip select (CS#) pin 124 must be de-asserted to initiate the internally self-timed program cycle.

The ready/busy pin 136 indicates that the device is busy during the program cycle. The ready/busy status can also be determined by reading the status register 120. In case the device is powered-down during the program cycle, the contents of the sector protection register 104A cannot be guaranteed. The reset pin 134 is disabled during the program cycle to prevent incomplete programming of the sector protection register 104A. Similar to the erase process discussed above, the sector protection register 104A can be reprogrammed with the sector protection enabled or disabled. Reprogramming the sector protection register 104A with the sector protection enabled allows the user to temporarily disable the sector protection to an individual sector rather than disabling sector protection completely.

The sector protection register 104A is preferably read immediately after the sector protection register 104A has been programmed or erased to verify that the program or erase operation was successful. The sector protection register 104A may also be read at other times. The reading procedure includes the following steps: the chip select (CS#) pin 124 must first be asserted. Then the appropriate 4-byte command sequence must be clocked in via the SI pin 128 or the $I/O_{7-0}$ pins 138-145. Depending on the devices after the last byte of the read command sequence has been clocked in, a number of "don't care" bytes may need to be clocked into the device before the data for the sector protection register 104A will be clocked out on to the SO pin 130 or the $I/O_{7-0}$ pins 138-145. In a preferred embodiment, eight sectors are used in the memory array 104, so eight bytes of data will be clocked out. The first byte corresponds to sector 0, the second byte corresponds to sector 1, the third byte corresponds to sector 2, and so on.

A significant feature of the present invention is that sector protection established by the sector protection register 104A can be achieved by either a software or a hardware controlled method. With reference to FIGS. 5A-5D, the software-controlled method uses an enable sector protection command to enable the sector protection. A table 500A in FIG. 5A lists the hexadecimal code sequence for the enable sector protection and the disable sector protection commands. The code for the enable sector protection command is 4-bytes long and specified as 3DH 2AH 7FH A9H. The code for the disable sector protection command is specified as 3DH 2AH 7FH 9AH. The enable and disable sector protection command codes are different only in the last byte. Following is the procedure to enable sector protection using the software-controlled method. First, the chip select (CS#) pin 124 must first be asserted. Once the chip select (CS#) pin 124 has been asserted, the appropriate 4-byte command sequence as described above must be clocked in via the SI pin 128 or the $I/O_{7-0}$ pins 138-145. After the last byte of the command sequence has been clocked in, the chip select (CS#) pin 124 must be de-asserted after which the sector protection will be enabled. Similarly, to disable the sector protection after the chip select (CS#) pin 124 has been asserted, the appropriate 4-byte sequence for the disable sector protection command must be clocked in via the SI pin 128 or the $I/O_{7-0}$ pins 138-145. After the last byte of the command sequence has been clocked in, the chip select (CS#) pin 124 must be de-asserted after which the sector protection will be disabled.

Besides the software-controlled protection method, a hardware controlled sector protection can alternatively be carried out by asserting the write protect (WP#) pin 132. As long as the write protect (WP#) pin 132 is asserted, any sector flagged for protection by the sector protection register 104A cannot be erased or re-programmed. In addition, while the write protect (WP#) pin 132 is asserted, the disable sector protection command will be ignored. It is important to shield the write protect (WP#) pin 132 against spurious noise that may inadvertently cause the write protect (WP#) pin 132 to assert or de-assert. A noise filter is incorporated into the device so that the write protect (WP#) pin 132 has to be asserted or de-asserted for more than 100 ns before the flagged sectors become either protected or unprotected.

When the write protect (WP#) pin 132 is asserted, certain sectors in the memory array will be protected, and when the write protect (WP#) pin 132 is de-asserted, the memory array 104 will be unprotected as long as the enable sector protection command was not issued while the write protect (WP#) pin 132 was asserted.

If the enable sector protection command was issued while the write protect (WP#) pin 132 was asserted, then simply de-asserting the write protect (WP#) pin 132 would not disable the sector protection. In this case, the disable sector protection command would need to be issued while the write protect (WP#) pin 132 is de-asserted to disable the sector protection.

The write protect (WP#) pin 132 overrides the software controlled sector protection method but only for protecting the sectors. In FIG. 5B, the plot illustrates three different stages of the write protect (WP#) pin 132. Events in the three stages are illustrated in FIG. 5C. In the first stage (time period), when the write protect (WP#) pin 132 is HIGH or de-asserted, and if the enable sector protection command has not previously issued, there is no protection and so sector protection is disabled, as illustrated in row 1 of stage (time period) 1, 502C. In the case when the disable sector protection command is issued, and the write protect (WP#) pin 132 is HIGH or de-asserted, the sectors are not protected regardless if the enable sector protection command was previously issued or not. This is reflected as disabled in the sector protection status column as illustrated in row 2 of stage (time period) 1, 502C. When the enable sector protection command is issued, and the write protect (WP#) pin 132 is still de-asserted or HIGH, the sector protection will be enabled regardless if the disable sector protection command was previously issued or not. This is illustrated in row 3 of time period 1 502C. In time period 2 504C, when the write protect (WP#) pin 132 is asserted, sector protection is enabled regardless whether the enable sector protection or the disable sector protection commands were issued. In time period 3 506C, when the write protect (WP#) pin 132 is de-asserted or HIGH again, sector protection will remain enabled if the enable sector protection command was issued during time period 1 502C or time period 2 540C. This is illustrated in row 1 of time period 3 506C. Of course, issuing the enable sector protection command while the write protect (WP#) pin 132 is de-asserted or HIGH again will enable the sector protection as illustrated in row 3 of time period 3 506C. On the other hand, when the disable sector protection command is issued during time period 3 506C, the sector protection will be disabled. This is illustrated in row 2 of the time period 3 506C.

The sector protection status can be monitored via a status register 500D. With reference to FIG. 5D, a status register 500D with 8-bits of data is adapted to indicate the status of the protection. Bit 1 in the status register 500D provides the information whether or not the sector protection has been enabled or disabled as discussed above and as shown in the last column of table 500C. A logical 1 indicates that sector protection has been enabled and a logical 0 indicates that protection has been disabled. Bit 7 indicates whether the device is ready or busy performing certain operations. Bits 2 through 5 indicate the device density code.

Figure 6:
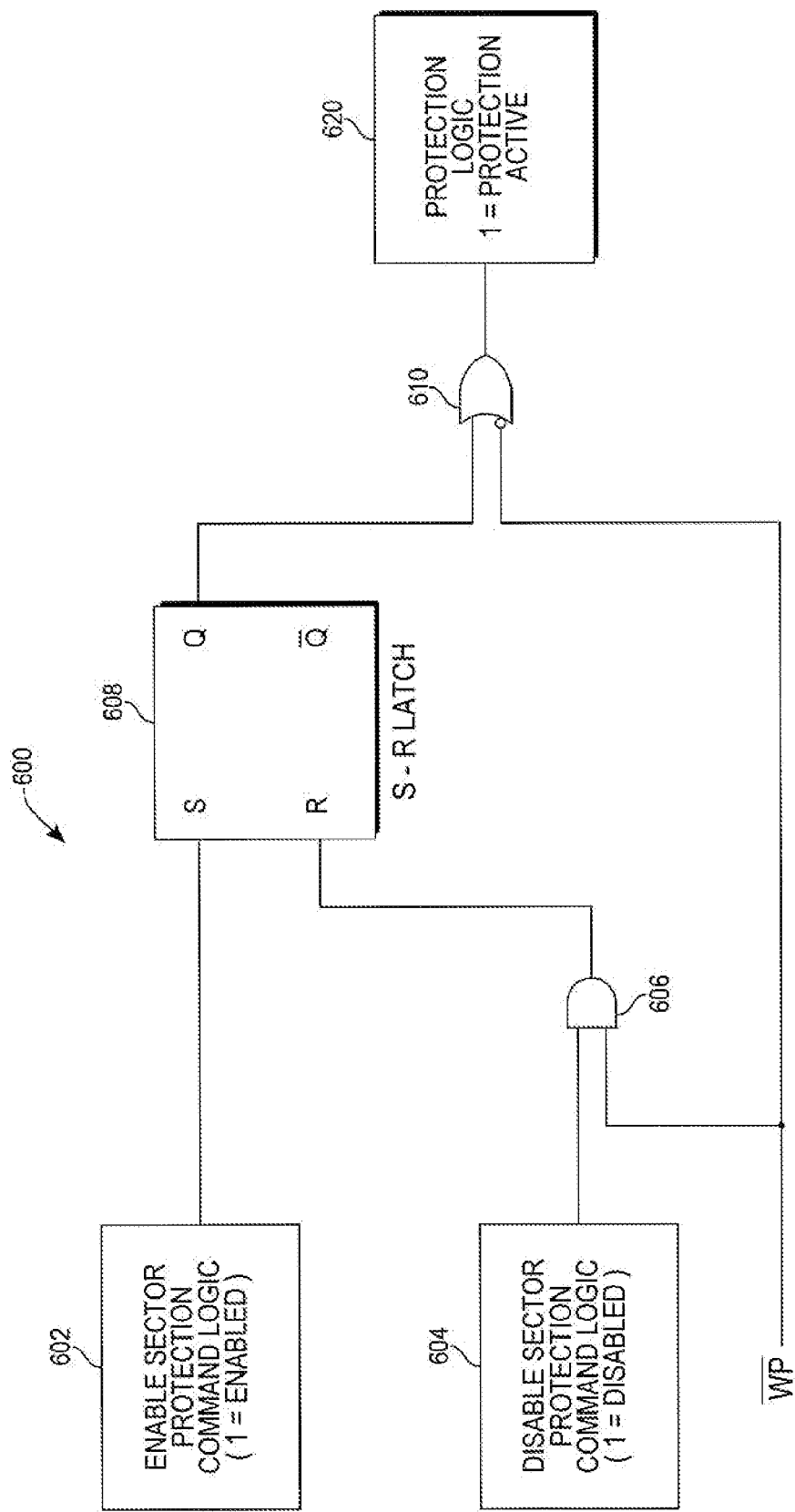
FIG. 6 illustrates a schematic diagram of a circuit implementing the table shown in FIG. 5C.

A hardware implementation of the write protection logic 106 as discussed in FIG. 5B, FIG. 5C, and FIG. 5D is illustrated in FIG. 6. The write protect (WP#) pin 132 is connected to an OR gate 610 to allow the write protect (WP#) pin 132, when asserted, to enable the sector protection logic 620 despite the state of the enable sector protection command logic 602 and the disable sector protection command logic 604. This implements the second row 504C of time period 2 in FIG. 5C. A single set-reset (S-R) latch 608 is used to control the result of the enable sector protection and disable sector protection commands. The S-R latch 608 is set when the enable sector protection command has been issued. When the S-R latch 608 is set, the sector protection logic 620 will be active since the result of OR gate 610 will be a logical 1. The S-R latch 608 in conjunction with AND gate 606 prevents the de-assertion of the write protect (WP#) pin 132 from disabling the sector protection logic 620 if the enable sector protection command was previously issued as shown in row 3 of time period 506C. When both the write protect (WP#) pin 132 and the disable sector protection command logic 604 are HIGH, by virtue of AND gate 606, the S-R latch 608 will be reset. As a result, the sector protection logic 620 will go LOW to indicate that protection is disabled. Asserting the device's reset (RESET#) pin 134 will not reset the S-R latch 608. This is a safeguard against protection being disabled if the reset (RESET#) pin 134 is asserted inadvertently by noise or some other circumstance.

With reference to FIGS. 7 and 8, a sector protection method is illustrated by a flow diagram. The sector protection method uses the sector protection register 104A that utilizes a single extra row of a memory array.

The sector protection method is divided into two parts. The first part involves the programming of the sector protection register 104A. The second part deals with enabling and disabling the sector protection. The first part begins (702) with defining which sectors of the memory array to protect (step 704). As described previously, the sector protection register 104A has a plurality of bytes. Each byte is dedicated to store locking information for a designated sector. Byte 0 is dedicated to sector 0; byte 1 to sector 1, and so forth. As mentioned previously, byte 0 is typically further divided into locking information for sub-sectors. Each sub-sector is capable of being separately locked.

Any previously stored sector protection information is erased (step 706) to clear all unwanted residual data prior to programming.

At step 708, the sector protection, information is programmed into the corresponding bytes of the sector protection register 104A. The data and command structures have been described in detail in FIG. 2, FIG. 3, FIG. 4, and FIG. 5.

At step 710, the locking information from the sector protection register 104A is read out to verify programming. This step is optional.

Erasing and reprogramming of the sector protection register 104A, as shown in FIG. 7, does not need to be performed every time sector protection is to be enabled or disabled. The sector protection register 104A only needs to be reprogrammed if the system needs to change which sectors are flagged for protection.

The second part of the sector protection method involves either enabling or disabling the sector protection (step 802) by using the software or hardware controlled techniques.

If choosing to enable the sector protection (step 804), then the system must decide whether to use the hardware or software protection method (step 806). With the hardware protection method (step 808), the process simply entails asserting the write protect (WP#) pin 132 (step 810). With the software protection method (step 812), the chip select (CS#) pin 124 must first be asserted (step 814). After the chip select (CS#) pin 124 is asserted, the enable sector protection command must be input into the device (step 816) via the SI pin 128 or the I/O$_{7-0}$ pins 138-145. The chip select (CS#) pin 124 must then be de-asserted (step 815) in order for the sector protection to be enabled.

If disabling the sector protection (step 822), then the system must decide whether to use the hardware or software method (step 824). If using the hardware method (step 826), then the system will first de-assert the write protect (WP#) pin 132 (step 828). If the system design never uses the software controlled method for enabling and disabling sector protection, then simply de-asserting the write protect (WP#) pin 132 will disable the sector protection. However, if the system uses a combination of both the hardware and software controlled methods for enabling and disabling the sector protection, then the system should determine whether the enable sector protection command was previously issued (step 830). This can be done by reading the status register 120 to see if the sector protection is still enabled. If sector protection is still enabled (step 834), then the system should proceed with the software method for disabling sector protection (step 836).

To disable the sector protection using the software controlled method (step 836), the system must first assert the chip select (CS#) pin 124 (step 839). After the chip select (CS#) pin 124 has been asserted, the system must input the disable sector protection command (step 840) via the SI pin 128 or the I/O$_{7-0}$ pins 138-145. The chip select (CS#) pin 124 must then be de-asserted (step 842) in order for the sector protection to be disabled.

The invention claimed is:

1. A semiconductor non-volatile memory device comprising:
   a memory array having a sector protection register amidst a plurality of sectors;
   a chip housing enclosing the memory array and having a plurality of pins, including a write protect (WP#) pin with first means for controlling sector protection, with other pins carrying data, including write protect data, said other pins having second means for enabling commands for controlling sector protection and the sector protection register, separately from the write protect (WP#) pin, said first and second means being both selectable on a chip to instantly establish write protection by the first means or the second means;
   write protection logic that receives an enable sector protection command, a disable sector protection command (signal), and a write protect (WP#) signal;
   said write protection logic providing a sector protection output (hardware or software).

2. The memory device of claim 1 wherein the write protection logic provides a sector protection output when the write protect (WP#) signal is active despite the state of the enable sector protection command and the disable sector protection command.

3. The memory device of claim 1 wherein the write protection logic includes:
   a set-reset (S-R) latch;
   a 2-input AND gate;
   a 2-input OR gate;
   a first enable-sector-protection input terminal that is adapted to receive an ENABLE/SECTOR PROTECTION COMMAND signal and that is connected to a set input terminal of the Set-Reset latch;
   a second disable-sector-protection input terminal that is adapted to receive a DISABLE/SECTOR PROTECTION COMMAND signal and that is connected to one input terminal of the 2-input AND gate and;
   a WP# input terminal that is adapted to receive a WP bar signal, that is connected to another input terminal of the 2-input AND gate; and that is connected to an inverting input terminal of the OR gate;

an output terminal of the 2-input AND gate is connected to a Reset input terminal of the Set-Reset latch; the Set-Reset latch having a Q output terminal that is connected to a non-inverting input terminal of the 2-input OR gate;

an output terminal of the 2-input OR gate at which is provided a Sector Protection Logic signal.

4. The memory device of claim 1 wherein said chip communicates with a host processor via an interface, the interface having said write protect (WP#) pin and said other pins.

5. The memory device of claim 1 wherein said interface is a serial interface having a serial in (SI) pin among said other pins carrying commands for controlling sector protection and the sector protection register.

6. The memory device of claim 1 wherein said interface is a parallel interface having bidirectional input/output (I/O$_{7-0}$) pins among said other pins carrying commands for controlling sector protection and the sector protection register.

7. The memory device of claim 1 further comprising a status register connected to command and control logic as well as to the interface.

8. The memory device of claim 1 wherein said sector protection register comprises a row of the memory array.

9. The memory device of claim 1 further including logic means for enabling sector protection, whereby the write protect (WP#) pin overrides the write protect data in said other pins.

10. The memory device of claim 1 wherein the size of the sector protection register is variable.

11. The memory device of claim 1 wherein the location of the sector protection register in the memory array is variable.

12. The memory device of claim 1 wherein the memory array comprises flash memory transistors.

13. The memory device of claim 1 wherein the sector protection register stores a number a bytes of data, with a single byte of data corresponding to one sector or a group of sub-sectors of the memory array.

14. A method for sector protection for a non-volatile memory array having a sector protection register, comprising: defining sectors to be protected in the memory array;
   programming the sector protection register with a number of discrete bytes of data, with a single byte of data corresponding to one discrete sector or a group of sub-sectors of the memory array;
   selecting a write protection method from a software write protection method and a hardware write protection method;
   enabling the hardware write protection method by asserting a write protect (WP#) pin;
   enabling the software write protection method by:
      asserting a chip select (CS#) pin;
      inputting an enable sector protection command signal;
      deasserting the chip select (CS#)pin.

15. The method of claim 14, including:
   disabling the write protection method selected from the software write protection method and the hardware write protection method;
   disabling the hardware protection method by:
      de-asserting the write protect (WP#) pin;
      asserting the chip select (CS#) pin for disabling the software write protection method;
      inputting a disable sector protection command;
      de-asserting the chip select (CS#) pin.

16. The method of claim 14, including:
   after disabling the hardware protection method by de-asserting the write protect (WP#) pin, checking to see if the software write protection method is still enabled;
   if the software write protection method is still enabled:
   asserting the chip select (CS#) pin;
   inputting a disable sector protection command; and
   de-asserting the chip select (CS#) pin.

17. The method of claim 14 including identifying discrete sectors to be protected with a separate sector number that corresponds to a byte in the sector protection register.

18. The method of claim 14 wherein defining sectors to be protected in the memory array includes defining the sector protection register to comprise a row of the memory array for storing a number of bytes of data with a single byte of data corresponding to one discrete sector or a group of sub-sectors of the memory array.

19. The method of claim 14 wherein defining sectors to be protected in the memory array includes providing a variable size for the sector protection register.

20. The method of claim 14 wherein defining sectors to be protected in the memory array includes providing a variable location for the sector protection register in the non-volatile memory array.

21. The method of claim 14 wherein the memory array comprises a flash memory array.

\* \* \* \* \*